(12) United States Patent
Nagashima

(10) Patent No.: US 7,242,615 B2
(45) Date of Patent: Jul. 10, 2007

(54) NON-VOLATILE SEMICONDUCTOR MEMORY DEVICE

(75) Inventor: Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 11/167,303

(22) Filed: Jun. 28, 2005

(65) Prior Publication Data

US 2005/0286308 A1 Dec. 29, 2005

(30) Foreign Application Priority Data

Jun. 29, 2004 (JP) ............................. 2004-191933

(51) Int. Cl.
*G11C 16/06* (2006.01)
(52) U.S. Cl. ........................... 365/185.09; 365/185.22; 714/718
(58) Field of Classification Search ........... 365/185.09, 365/185.22; 714/718
See application file for complete search history.

(56) References Cited

U.S. PATENT DOCUMENTS 5,369,615 A * 11/1994 Harari et al. .......... 365/185.09

7,024,598 B2 * 4/2006 Jeong et al. ................. 714/718
2001/0046169 A1 * 11/2001 Morzano ..................... 365/207

FOREIGN PATENT DOCUMENTS

| JP | 2002-140899 | 5/2002 |
|----|-------------|--------|
| JP | 2002-197898 | 7/2002 |
| WO | WO 02/37503 A1 | 5/2002 |

* cited by examiner

*Primary Examiner*—Huan Hoang
(74) *Attorney, Agent, or Firm*—Oblon, Spivak, McClelland, Maier & Neustadt, P.C.

(57) ABSTRACT

A non-volatile semiconductor memory device includes: a memory cell array with electrically rewritable and non-volatile memory cells arranged therein; a data hold circuit configured to hold read data or write data of the memory cell array; a data bit detection circuit so connected to the data hold circuit as to detect a bit number of "0" or "1" in data held therein; and an internal control circuit, which serves for controlling data write, erase and read, and includes a data bit register for storing the bit number detected by the data bit detection circuit, the internal control circuit serving to output the bit number stored in said data bit register to external terminals in response to a command input.

15 Claims, 10 Drawing Sheets

| (B2, B1, B0) | Ipass | Detection Number of Fails |
|---|---|---|
| (0, 0, 0) | 0.5I | $\geq 1$ |
| (0, 0, 1) | 1.5I | $\geq 2$ |
| (0, 1, 0) | 2.5I | $\geq 3$ |
| (0, 1, 1) | 3.5I | $\geq 4$ |
| (1, 0, 0) | 4.5I | $\geq 5$ |
| (1, 0, 1) | 5.5I | $\geq 6$ |
| (1, 1, 0) | 6.5I | $\geq 7$ |
| (1, 1, 1) | 7.5I | $\geq 8$ |

| I/O0 | I/O1 | I/O2 | I/O3 | I/O4 | I/O5 | I/O6 | I/O7 |
|---|---|---|---|---|---|---|---|
| True Pass or Fail | Pseudo Pass or Fail | Fail Bit Resister 0 | Fail Bit Resister 1 | Fail Bit Resister 2 | Fail Bit Resister 3 | Don't Care | Don't Care |

| I/O0 | I/O1 | Status |
|---|---|---|
| 0 | 0 | True Pass |
| 1 | 0 | Pseudo Pass |
| 1 | 1 | Fail |

NON-VOLATILE SEMICONDUCTOR MEMORY DEVICE

CROSS-REFERENCE TO RELATED APPLICATION

This application is based on and claims the benefit of priority from the prior Japanese Patent Application No. 2004-191933, filed on Jun. 28, 2004, the entire contents of which are incorporated herein by reference.

BACKGROUND OF THE INVENTION

1. Field of the Invention

This invention relates to a non-volatile semiconductor memory device, and more particularly to such a device function that detects a data state of an internal data hold circuit.

2. Description of Related Art

In a NAND-type flash memory, which is known as an EEPROM, data read or write is usually performed by a page, and this makes it possible to perform data write and read at a substantially high rate. Data erasure of the flash memory is usually performed by a block including plural pages, so that it is possible do data erase at a high rate.

Data write is performed, after having loaded one page write data into a data register (i.e., page buffer) in such a way that data are serially input byte by byte, by repeat of a write cycle including a write voltage application operation and the following verify-read operation until the entire data are written.

Usually, a positive threshold voltage state of a memory cell, which is a result of that electrons have been injected into the floating gate of the memory cell, is defined as a "0" data state. An operation for achieving this state is what is called a write operation in the narrow sense. A negative threshold voltage state of a memory cell, which is obtained by releasing electrons of the floating gate, is defined as a "1" data state. An operation for achieving this state is an erase operation in the narrow sense.

In every write cycle, write in the narrow sense (i.e., "0" data write) and write-inhibit (i.e., "1" data write) are controlled based on data "0" and "1", respectively. When "0" write is verified as a result of verify-read, write data "0" held in the page buffer is inverted to "1", and it becomes a write-inhibiting state hereinafter. Therefore, detect a state where all data is "1" in the page buffer, and it may be confirmed a write completion of one page.

In case data write is not completed in spite of that the number of write cycles has reached a predetermined maximum value (i.e., maximum write pulse application numbers) Nmax, the data write will be usually ended in "Fail". However, if the judgment of whether the number of write cycles has reached the maximum value Nmax or not is done prior to the verify-read step, the result of Nmax detection should not always be ended in failure because there is a possibility that it has become "Pass" at the last write time.

To confirm that the entire page data have been written, or to detect how many faulty or defective bits (refer to as "fail bit" hereinafter), which have not be normally written, are there, it will be used a "fail bit count" method. This is such a method that the final verify-read is performed prior to ending the write sequence based on the detection that write cycle number has reached the maximum value, and then the resultant data held in the page buffer is read out to be subjected to fail bit number (i.e., "0" data bit number) counting.

However, since it is required of the conventional fail bit counting method to read the entire data in the page buffer, it takes a long time to do it. Explaining in detail, data in the page buffer are serially output to the input/output terminals byte by byte. Therefore, supposing that one page is constituted by N bytes, it is necessary for outputting the entire data in the page buffer to repeat the data output operation N times.

By contrast to this, there has been provided such a scheme that a fail bit counter circuit is prepared to be connected to the page buffer in the chip for counting fail bit numbers in a short time period (for example, refer to Unexamined Japanese Patent Application Publication No. 2002-140899).

SUMMARY OF THE INVENTION

According to an aspect of the present invention, there is provided a non-volatile semiconductor memory device including: a memory cell array with electrically rewritable and non-volatile memory cells arranged therein; a data hold circuit configured to hold read data or write data of the memory cell array; a data bit detection circuit so connected to the data hold circuit as to detect a bit number of "0" or "1" in data held therein; and an internal control circuit, which serves for controlling data write, erase and read, and includes a data bit register for storing the bit number detected by the data bit detection circuit, the internal control circuit serving to output the bit number stored in the data bit register to external terminals in response to a command input.

According to another aspect of the present invention, there is provided a non-volatile semiconductor memory device including: a memory cell array with electrically rewritable and non-volatile memory cells arranged therein; a data hold circuit configured to hold verify-read data at a data write time or an data erase time; a fail bit counter circuit configured to count a fail bit number based on the data held in the data hold circuit prior to ending of data write or erase in failure; a fail bit register, to which the fail bit number detected by the fail bit count circuit is transferred and stored in; and a status register configured to store status data defined based on the result detected by the fail bit counter circuit, wherein the status data is output together with the fail bit number to the external terminals in response to a certain command input.

According to still another aspect of the present invention, there is provided a memory system including: a flash memory device; and an ECC circuit prepared inside or outside of the flash memory device for correcting read data thereof, wherein the flash memory device has a function of: detecting a fail bit number in the device; and outputting a status data defined based on the detected fail bit number to external terminals, and wherein in case the detected fail bit number is in a permissible range with relation to the error correcting function of the ECC circuit, the status data is so output as to designate a pseudo-pass state.

DETAILED DESCRIPTION OF THE EMBODIMENTS

Illustrative embodiments of this invention will be explained with reference to the accompanying drawings below.

Figure 1:
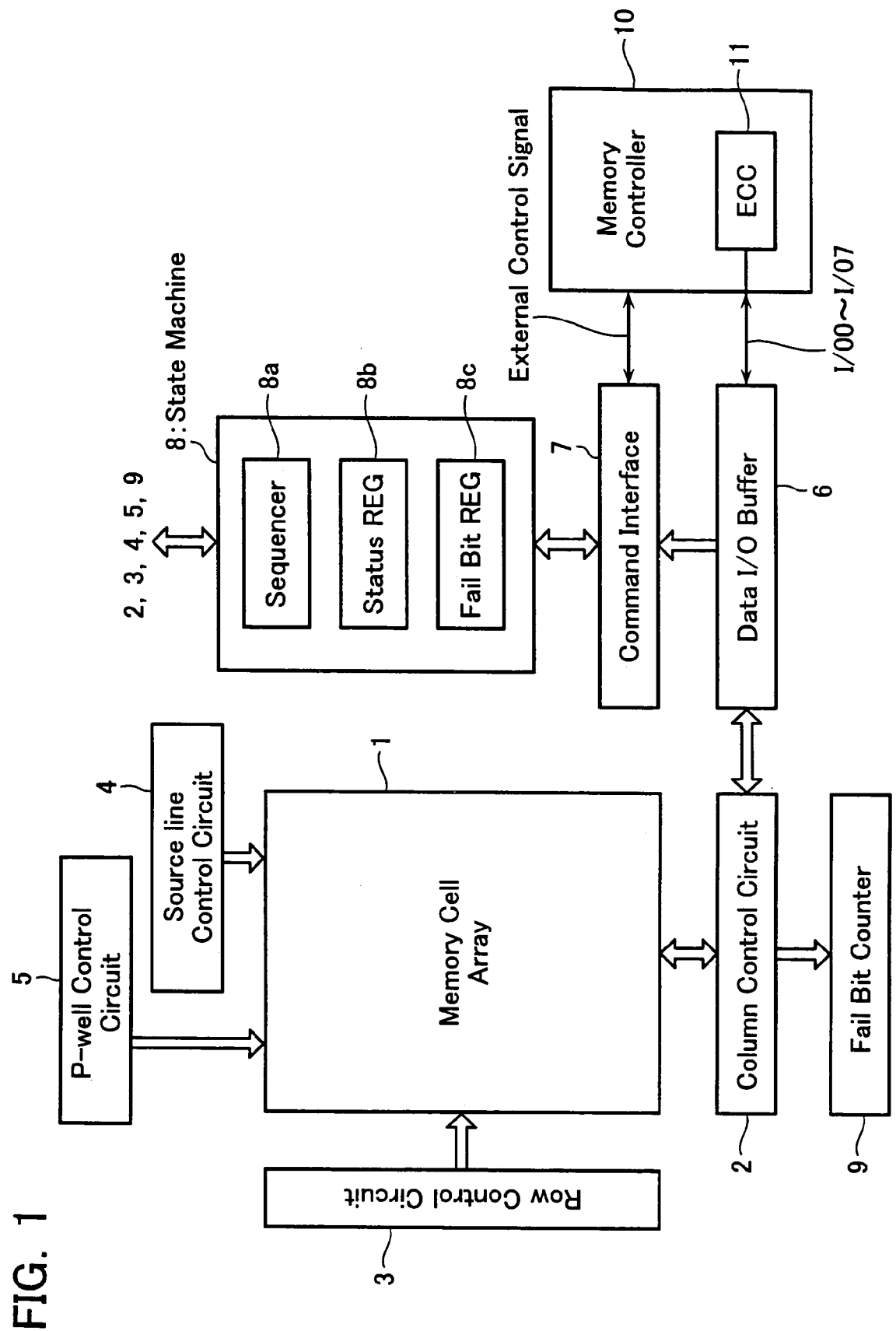
FIG. 1 shows a functional block configuration of a NAND-type flash memory in accordance with an embodiment of the present invention.
Figure 2:
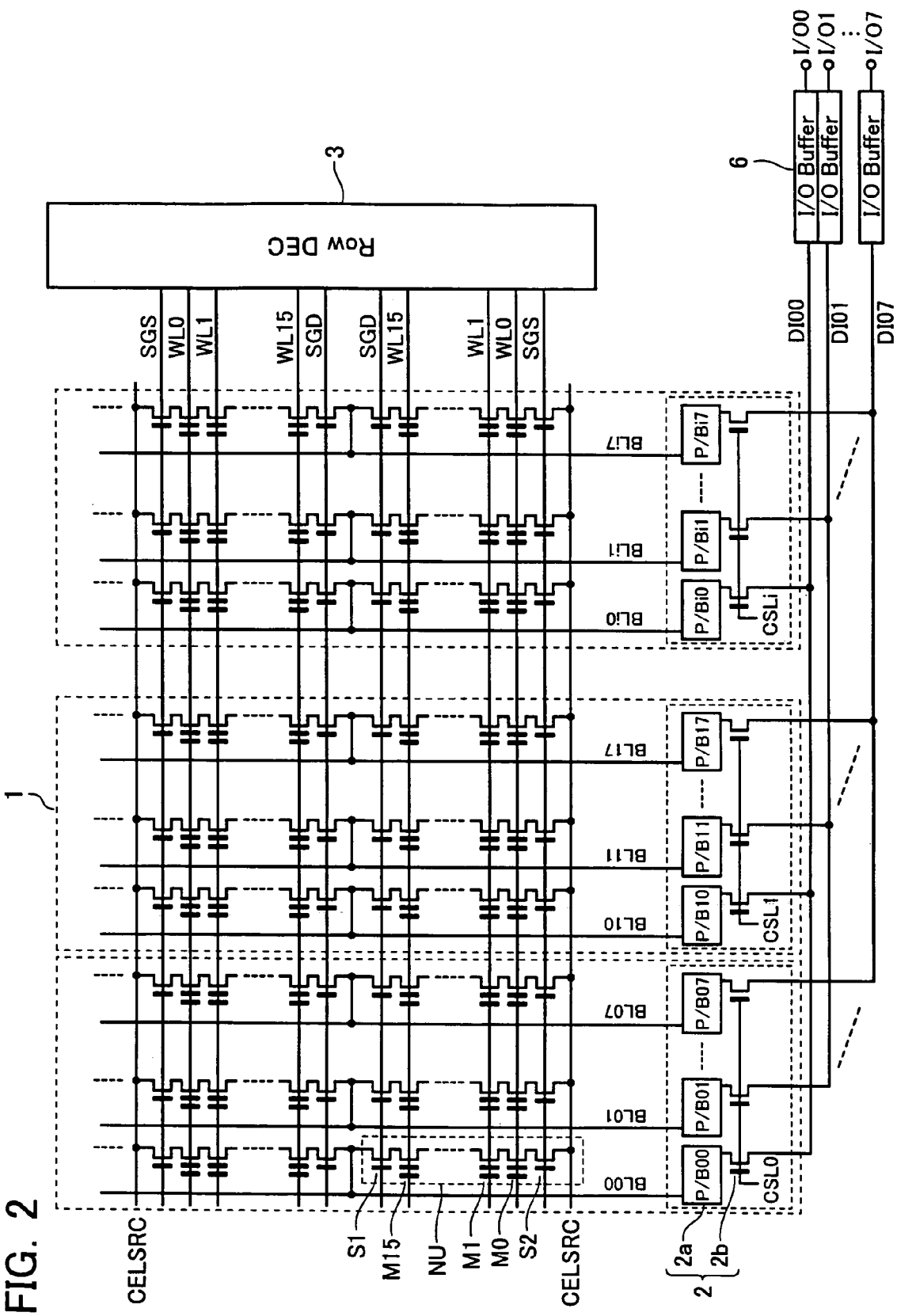
FIG. 2 shows the memory cell array and column control circuit in the flash memory.
Figure 3:
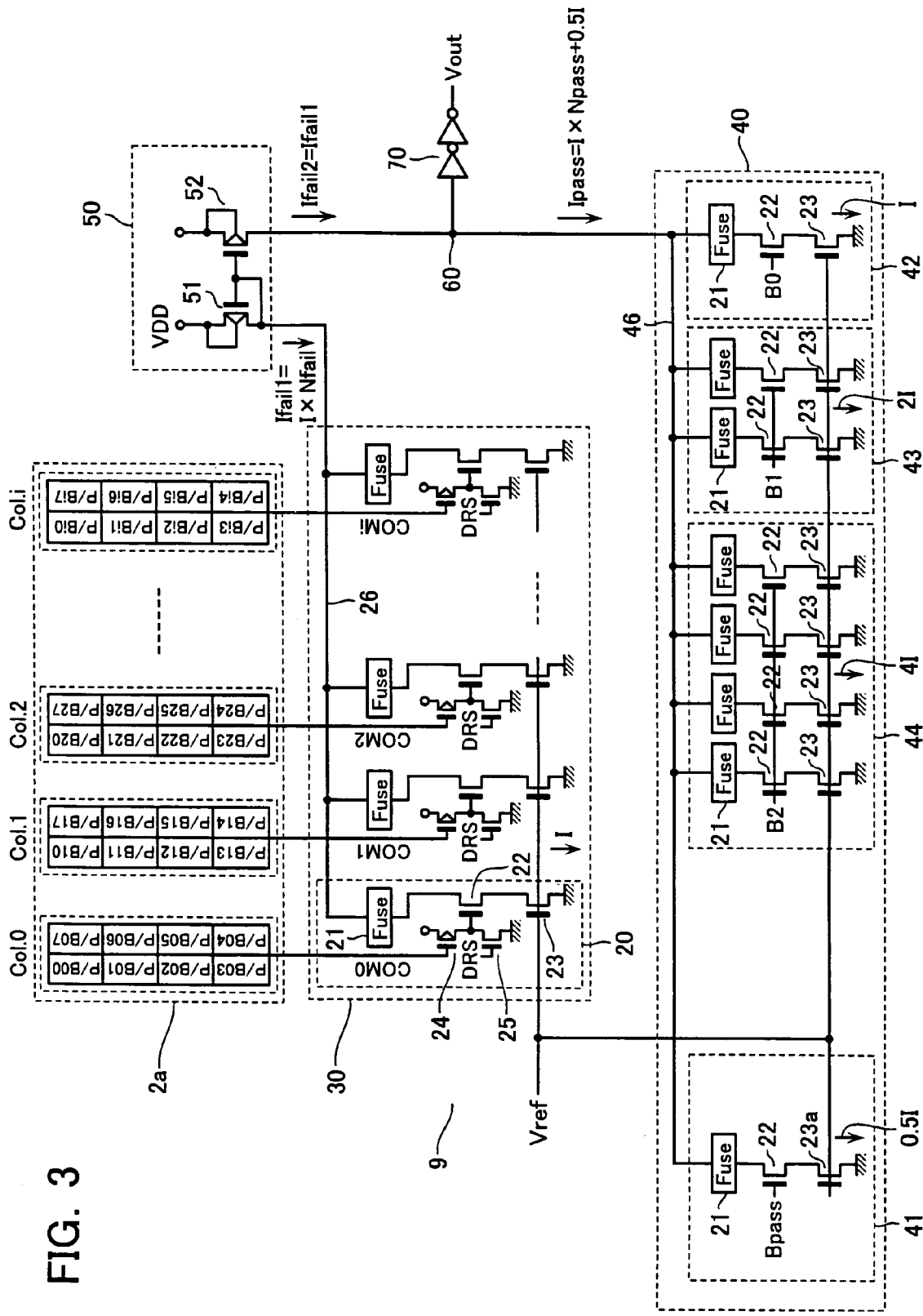
FIG. 3 shows a configuration of a fail bit count circuit in the flash memory.

FIG. 1 shows a functional block configuration of a NAND-type flash memory in accordance with an embodiment, and FIGS. 2 and 3 show a memory cell array 1 and a column control circuit 2 therein.

Memory cell array 1 is, as shown in FIG. 2, formed of NAND cell units NU arranged therein. Each NAND cell unit NU has plural (i.e., sixteen in this example) electrically rewritable and non-volatile memory cells M0-M15 connected in series, the both ends of which are coupled to a bit line BLij and a common source line CELSRC via select transistors S1 and S2, respectively. Control gates of the memory cells M0-M15 in the NAND cell unit NU are coupled to different word lines WL0-WL15, respectively; and gates of the select transistors S1 and S2 to select gate lines SGD and SGS, respectively.

A set of memory cells arranged along a word line constitutes a page (or two pages), which serves as a unit of data read and write. A set of NAND cell units arranged along a word line constitutes a block, which usually serves as a unit of data erase.

A row control circuit 3 has word line drivers with row decoders, which are coupled to and drive the word lines and select gate lines in the memory cell array 1. A column control circuit 2 is a sense amplifier circuit 2a serving as a data hold circuit (refer to as a page buffer circuit hereinafter) and a column gate circuit 2b, which is coupled to the bit line BLij in the memory cell array 1 for performing data read and write. Page buffer circuit 2a has sense amplifiers (serving as data registers) P/Bij for holding one page read and write data.

Source line voltage control circuit 4 is for controlling voltage of the source line CELSRC in the cell array 1 in accordance with operation modes. P-well voltage control circuit 5 controls voltage of a p-type well, on which the memory cell array 1 is formed, in accordance with operation modes.

In a data read mode, data of a selected page of the memory cell array 1 are read out to the page buffer circuit 2a. The read data in the page buffer circuit 2a are selected byte by byte via column gate circuit 2b, which are sequentially selected by a column select signal CSLi, to be serially transferred on data lines DIO0-DIO7 and output to the external input/output terminals I/O0-I/O7 via data input/output buffer 6.

In a data write mode, write data are serially input byte by byte via the input/output terminals I/O0-I/O7, whereby one page write data are loaded in the page buffer circuit 2a. These one page write data are written into a selected page in the memory cell array 1 at a time.

Command interface 7 receives command data supplied via the input/output terminals in response to one of external control signals for defining operation modes and transfer it to a state machine 8, which serves as an internal control circuit. State machine 8 decodes the command data to execute directed operation control. In detail, the state machine 8 distinguishes between write data and address data based on the command, and transfers write data and address data to the page buffer circuit 2a and row control circuit 3, respectively. Further, the state machine 8 controls of data write, read and erase operations with a sequencer 8a.

Connected to the page buffer circuit 2a in the column control circuit 2 is a data bit detection circuit 9, which is disposed for counting a bit number of "0" or "1" within the data held in the page buffer circuit 2a. This data bit detection circuit 9 is, in this embodiment, so controlled by the state machine 8 as to detect a fail bit number in the data held in the page buffer circuit 2a when data write or erase is incompletely ended. Therefore, it will be referred to as a "fail bit counter circuit" hereinafter.

The fail bit number detected by the fail bit counter circuit 9 is transferred to and held in a fail bit register 8c prepared in the state machine 8. Memory states such as "True Pass", "Pseudo Pass" and "Fail" are defined based on relationships between the fail bit number data and the error correction function of this flash memory, and status data thereof will be stored in a status register 8b prepared in the state machine 8.

Memory controller 10 is for externally controlling this flash memory, and it inputs command and address or inputs/outputs data via the input/output terminals I/O0-I/O7. Further, the memory controller 10 supplies various external control signals such as write enable signal, read enable signal and so on into the flash memory via external control terminals disposed independently from the input/output terminals. Disposed in the memory controller 10 is an ECC circuit 11, which performs error-checking and correcting of read data.

Figure 4:
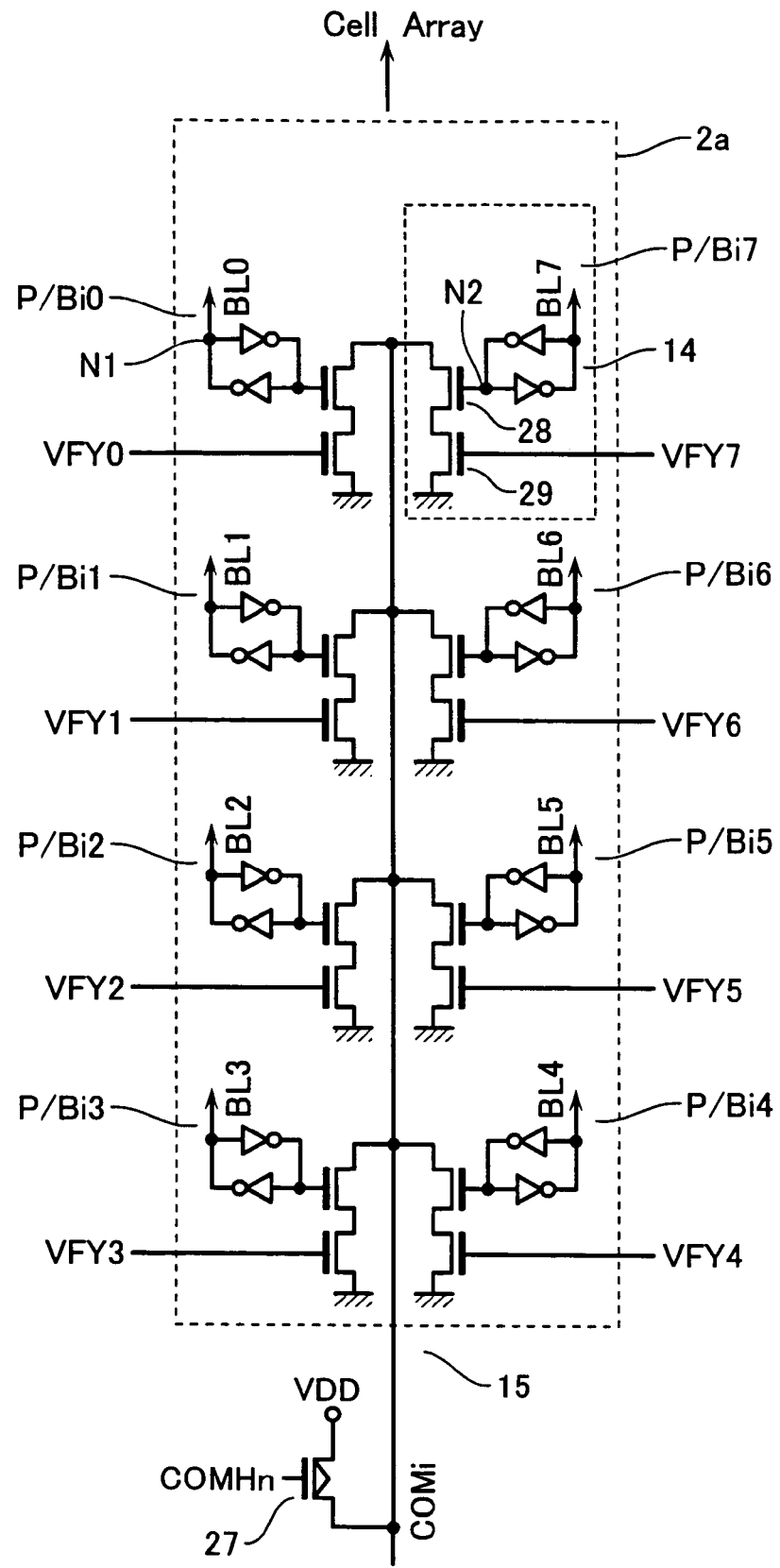
FIG. 4 shows a verify-judging circuit portion in the page buffer circuit in the flash memory.

Fail bit counter circuit 9 serves for detecting a fail bit number based on the judgment result of a verify-judge circuit prepared in the page buffer circuit 2a, and detailed configuration thereof is shown in FIGS. 3 and 4. FIG. 3 shows such an example of the fail bit counter circuit 9 that counts the fail bit number with monitoring verify-judging signal lines COM0-COMi disposed for every column of the page buffer circuit 2a. FIG. 4 shows a verify-judging circuit 15 with giving attention to sense amplifiers P/Bi0-P/Bi7 within one column. The verify-judging circuit 15 has NMOS transistors 28, each gate of which is coupled to data node N2 of a latch circuit 14 in each sense amplifier P/Bij, and NMOS transistors 29 for activating the corresponding NMOS transistors 28 and a common judging signal line COMi, to which all drains of NMOS transistors 28 are connected in common.

The judging signal line COMi is disposed as being shared by eight latch circuits 14 in every column. For example, supposing that one page is constituted by 8×66=528 bits, sixty six (i.e., 66-columns) judging signal lines COMi(i=0, 1, . . . , 65) are arranged. Each data node N1 of the latch circuits 14 is coupled to a bit line BL. A PMOS transistor 27 is coupled to the judging signal line COMi for precharging it at "H" level prior to verify-judgment.

To detect each data state of one page data (i.e., 528-bit data) held in the page buffer circuit, control signals VFY0-VFY7 are input to gates of NMOS transistors 29 in the sense amplifiers P/Bi0-P/Bi7, respectively. These control signals VFY0-VFY7 are used for detecting fail bit numbers in every 66 columns, which are to be output to eight external input/output terminals I/O0-I/O7.

To detect the fail bit number, the signal line COMi is precharged to "H" level (=VDD) via PMOS transistor 27, and then control signals VFY0-VFY7 are sequentially set to be "H". For example, when VFY0="H", Pass/Fail judging operations are performed simultaneously for 66 sense amplifiers P/Bi0, which correspond to input/output terminal I/O0, based on data at every data node N2. Supposing that when verify-read is resulted in "Pass" and "Fail", data node N2 becomes "L" and "H", respectively, transistor 28 is kept off in a passed sense amplifier, so that the signal line COMi is not discharged while the path of transistors 28 and 29 becomes on in a failed sense amplifier, so that the signal line COMi is discharged to be low in potential.

As similar to the above-description, the following control signals VFY1-VFY7 are sequentially set to be "H" after having precharged the signal line COMi, it may be judged "Pass" or "Fail" for data held in 66 sense amplifiers corresponding to input/output terminals I/O1-I/O7, respectively.

Fail bit counter circuit 9 detects whether the verify-judge signal line COMi is lowered or not for each column, thereby detecting the fail bit number. As shown in FIG. 3, the fail bit counter circuit 9 has a first current generating circuit 30', which generates a first current corresponding to a fail bit number, and a second current generating circuit 40, which generates a second current serving as a reference for judging the fail bit number. Current mirror circuit 50 with PMOS transistors 51 and 52 and current-voltage converting circuit 70 constitute a comparator circuit for comparing the first current with the second current to output a detection signal.

The first current generating circuit 30 has current passages 20 with the same number as the judging signal lines COMi. Each current passage 20 has: a PMOS transistor 24, gate of which is connected to the judging signal line COMi; a first NMOS transistor 25 connected in series to the PMOS transistor 24, which is driven by a signal DRS complementary to that of the signal line COMi; a second NMOS transistor 22, gate of which is connected to the connection node between transistors 24 and 25; and a third NMOS transistor 23 connected in series to the second NMOS transistor 22. Each drain of the NMOS transistors 22 in the current passages 20 is coupled to a common output node 26 via a fuse device 21.

At a column where "Fail" is judged, PMOS transistor 24 is turned on, thereby turning on NMOS transistor 22. At this time, current I defined by the current source NMOS transistor 23 flows to the node 26 via the fuse device 21 if it is conductive.

Connected to the node 26 is PMOS transistor 51, gate and drain of which are connected to each other, serving as a current load. This PMOS transistor 51 and another PMOS transistor 52, gates of which are coupled to each other, constitute a current mirror circuit 50. Suppose here that PMOS transistors 51 and 52 have the same size, and PMOS transistor 52 is driven in a pentode operation region. Under this condition, when either one of control signals VFY0-VFY7 becomes "H", and detected fail bit number is Nfail, a current, Ifail1=I×Nfail, flows from the PMOS transistor 51 as defined by the current generating circuit 30, and in response to this, an output current, Ifail2=Ifail1, flows from the PMOS transistor 52.

To generate a reference current used for judging the output current level of the current mirror circuit 50, the second current generating circuit 40 is prepared. This second current generating circuit 40 is a so-called permitted fail bit number setting circuit with a D/A converter arrangement.

Explaining in detail, there are prepared current source circuits 41, 42, 43 and 44, which flow reference currents 0.5I, I, 2I and 4I, respectively, in the current generating circuit 40. In the current source circuit 41, a current source NMOS transistor 23a is prepared, in which W/L ratio (i.e., ratio of channel width W to channel length L) is a half of that of the current source transistor 23 in the current source circuit 30. This transistor 23a is coupled to a node 46 via an NMOS transistor 22 and a fuse device 21. NMOS transistor 22 is driven by a control signal Bpass, which becomes "H" at a fail detection time.

There are prepared one, two and four current source NMOS transistor(s) 23, each of which has the same W/L ratio as that in the current source circuit 30, in the current source circuits 42, 43 and 44, respectively. These transistors 23 are coupled to the node 46 via select transistors 22 driven by select signals B0, B1 and B2 and via fuse devices 21, respectively.

With this arrangement, the current generating circuit 40 is able to selectively output either one of eight level currents (i.e., 0.5I, 1.5I, 2.5I, . . . , 7.5I) as a reference current Ipass flowing in the node 46 in response to the select signals B0-B2, one of which is selected in accordance with a fail bit number to be detected. These reference current values may be suitably set with programming the fuse devices 21. Although as a reference current for judging a no fail state, 0.5I is used in this current source circuit 41, another current value smaller than I may be used in place of the above-described reference current.

As the fuse devices 21 used in the current generating circuits 30 and 40, laser-blow type of fuses or electric fuses may be used.

Node 46 is coupled to the input node 60 of the converter circuit 70 together with the drain of the output transistor 52 in current mirror circuit 50. Therefore, operating voltage at the input node 60 is determined by the relationship between the reference current Ipass and output current Ifail2 of the transistor 52, and it becomes detected output voltage Vout of the voltage converter circuit 70.

Figures 5, 6:
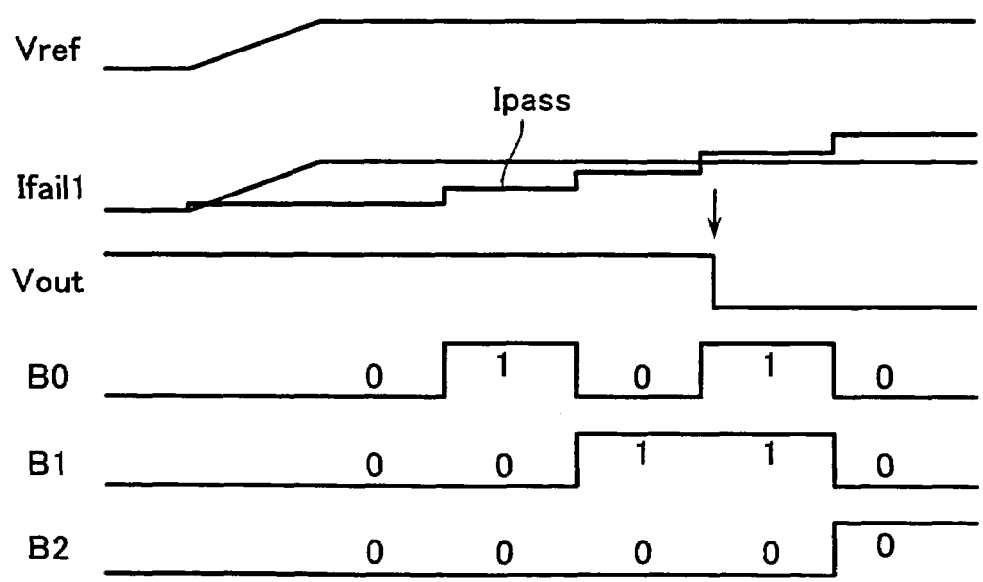
FIG. 5 is a diagram for explaining a fail bit count operation of the fail bit count circuit.
FIG. 6 shows waveforms for explaining the fail bit count operation of the fail bit count circuit.

FIG. 5 shows a relationship between the combinations of select signals B0-B2 and detectable fail bit numbers. In case of (B2, B1, B0)=(0, 0, 0), reference current Ipass which is able to be carried by the current generating circuit 40 is as follows: Ipass=0.5I. If all "Pass" in the sense amplifiers P/B of the entire columns in this case (in other words, if the entire verify-judging signal lines COMi are "H"), it is obtained the following relationship of: Ifail1=Ifail2=0. Therefore, the node 60 becomes "H" level. In response to this, "H" level output is obtained at the output node Vout. By contrast, when there is one fail bit, Ifail1=Ifail2=I. In this case, the operation voltage at the node 60 is shifted to be "L" level side, and resulting in that the output node Vout is "L". Therefore, by use of (B2, B1, B0)=(0, 0, 0), it is possible to detect whether the fail bit number is one or more or not.

In case of (B2, B1, B0)=(0, 0, 1), the reference current is as follows: Ipass=1.5I. In this case, Vout="H" shows that the fail bit number is one or zero, i.e., in a permissible value while Vout="L" designates that two or more fail bits have been detected. As the same as described above and as shown in FIG. 5, it may be selected the fail bit number to be detected based on the combination of (B2, B1, B0).

In order to detect how many the fail bit number is, as shown in FIG. 6, sequentially increment the select signals (B2, B1, B0). According to this sequence, when the reference current Ipass is over Ifail1(=Ifail2), that is proportional to the fail bit number, Vout becomes "L", whereby it may be detected the fail bit number.

As described above, to count the fail bit number, it is required to increment the select signals (B2, B1, B0) in order and monitor the output Vout. The increment number will be selected in the order of number of the redundant columns, which are prepared for each cell array for replacing defective columns therein. If the number of redundant columns is eight for each cell array, select signals (B2, B1, B0) with three bits as described above or four bits select signals of (B3, B2, B1, B0) are prepared. In this case, increment the select signals seven or fifteen times, and it is possible to detect whether or not the fail bit number is permissible under the condition of the column redundancy scheme.

Note here that it may be used such a scheme that when the fail bit number is detected to be over a predetermined value, the fail bit counting operation will be ended in response to the output Vout="L". By use of such the scheme, it is able to detect in a short time whether the fail bit number of the chip is over a permissible value or not.

According to this embodiment, as described above, it is able to count the fail bit number in a short time in comparison with the conventional case where data of all sense amplifiers in the page buffer are read out outside of the chip, and then fail bit count is performed.

Although in the above-described embodiment, the fail bit number has been counted based of the verify-read data held in the page buffer 2a, this invention is not limited to this embodiment. Generally speaking, the data bit detecting circuit is used for counting "0" data bit quantity or "1" data bit quantity in binary data held in the page buffer 2a without regard to "Pass/Fail" of write-verify.

What is material in this embodiment is that the fail bit number detected by the fail bit counter 9 is transferred to and held in the fail bit register 8c in the state machine 8. Further, whether the fail bit number is permitted or not in this flash memory is determined with relation to correction ability of the ECC circuit 11 in the memory controller 10. For example, if the ECC circuit 11 is for correcting one bit error, one bit fail is permitted. Therefore, the state machine 8 has the status register 8b for teaching a flash memory chip state of Pass/Fail determined with relation to the ECC circuit 11 to the exterior. The fail bit number data and status data stored in the fail bit register 8c and status register 8b, respectively, may be output to the input/output terminals I/O0-I/O7 via the input/output buffer 6.

Figure 7:
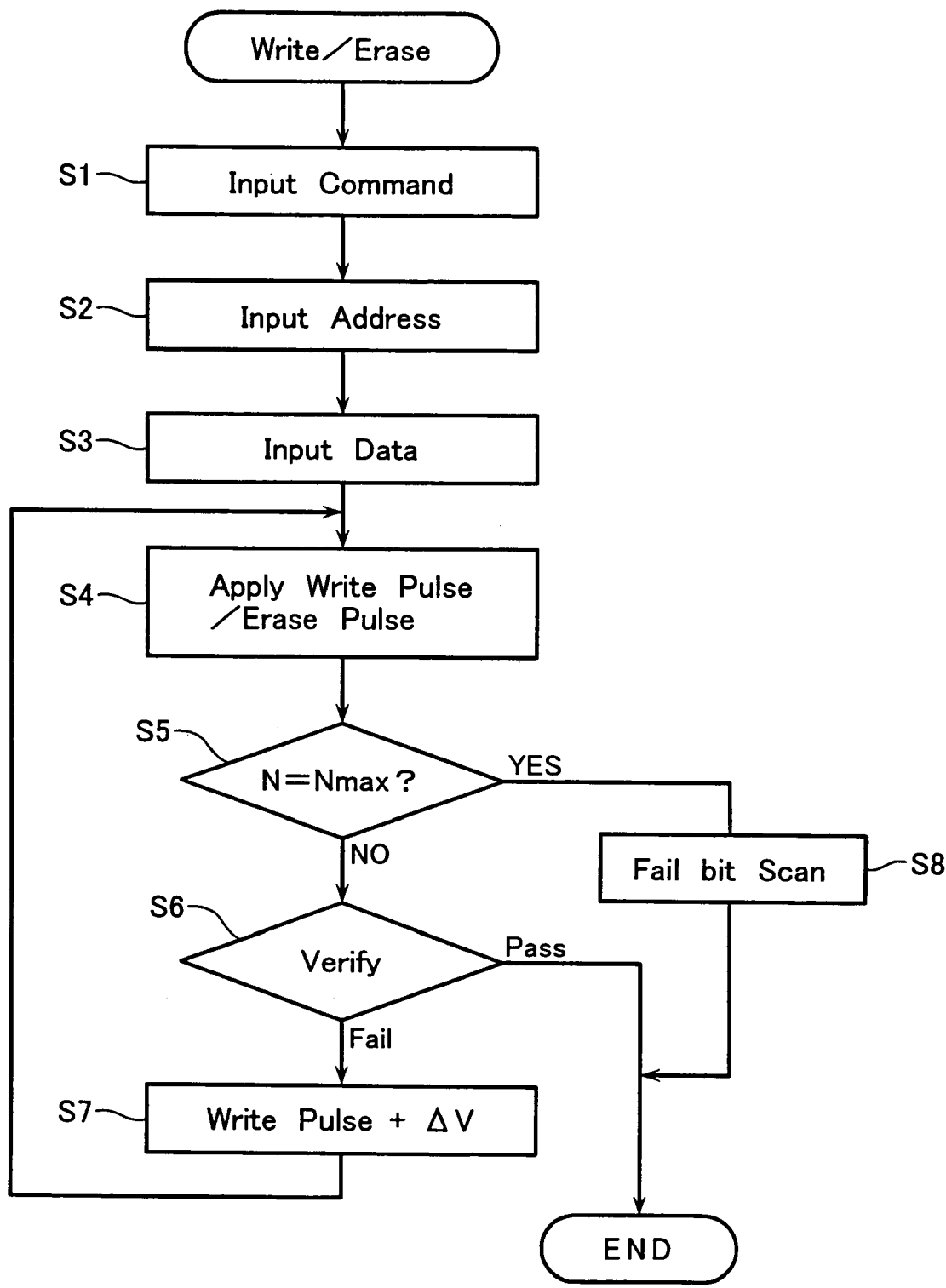
FIG. 7 is a flow chart for explaining a write/erase sequence of the flash memory.

Next, write-test operation, fail bit scanning operation and the following fail bit number output operation will be explained in detail. FIG. 7 shows a data write sequence for one page. A data erase sequence for a block may be about the same as shown in FIG. 7.

Command input (step S1), address input (step S2) and data input (step S3) are successively performed, following it data write is performed under the control of the state machine 8. In case of data erase, there is no data input.

In case of write-test, one page write data, all of which is "0", are loaded in the page buffer circuit 2a in the column control circuit 2, and then the respective NAND cell channels are controlled in potential based on the write data. Although details of the write operation are omitted, with applying a write voltage pulse to a selected word line (step S4), selected memory cells are written into a positive threshold state ("0" data) due to electron injection into floating gates thereof.

After the write voltage pulse application, it is detected whether the write cycle number has reached the maximum value Nmax or not (step S5). If "NO", verify-read is performed for verifying the write state (step S6).

In the verify-read, at a bit where "o" write has been confirmed, "0" data in the page buffer is inverted into "1" data, and this bit becomes a "0" write-inhibiting state hereinafter. Therefore, if one page data in the page buffer circuit become an all "1" state, verify-judgment is passed, and this data write sequence will be normally ended. In case there is at least one memory cell, into which "0" data is not completely written, the write voltage pulse is stepped up (step S7), and write voltage pulse application will be performed again (step S4).

In case the write cycle number has reached the maximum value Nmax without write completion, fail bit scanning is performed (step S8). That is, state machine 8 makes the fail bit counter 9 active after the final verify-read, thereby executing fail bit number detection. When the fail bit count operation is ended, the write sequence will be ended.

As described above, in case of 1 page=528 bits, the fail bit count is performed with verify-judging operations eight times for every 66 bits with sequentially making the control signals VFY0-VFY7 "H". That is, fail bit count is performed for each verify-judgment result with incrementing the select signals B0-B2, whereby the fail bit number in one page may be obtained.

If the test-write and fail bit count operations are repeatedly performed for the entire pages in a block, fail bit number in the block may be detected.

The result of the fail bit counting is able to be output in response to a command input from exterior. That is, as shown in FIG. 8, when a certain command is input (step S11), the state machine 8 decodes this command and outputs data stored in the fail bit register 8c and status register 8b outside of the chip (step S12).

Figures 8, 9, 10:
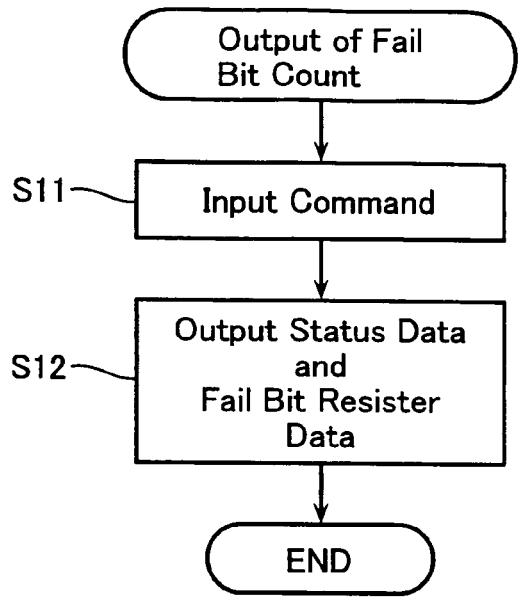
FIG. 8 is a flow chart for explaining output operations of outputting fail bit number and status data.
FIG. 9 is a diagram showing data output states of fail bit number and status data.
FIG. 10 is a diagram showing a relationship between the output status data and states designated thereby.

FIG. 9 shows an output state of the status data and fail bit number data on the external input/output terminals I/O0-I/O7. For example, two-bit status data in the status register 8b are output to the terminals I/O0 and I/O1, while supposing that the fail bit register 8c is formed to store 4-bit fail bit number data, these data are output to the terminals I/O2-I/O5.

Two-bit status data on the input/output terminals I/O0 and I/O1 are defined as follows: "00" designates a true pass state where there are no fails; "10" a pseudo-pass state where the fail bit number is in a permissible range with relation to ability of the ECC circuit; and "11" a fail state where the fail bit number is over the permissible range with relation to ability of the ECC circuit.

In response to the above-described data output, the memory controller 10, which is an external system, may precisely recognize the flash memory state. For example, it may be performed in the memory controller 10 such address management that a "pseudo-pass" block is temporarily resisted as a faulty block or "bad block" not to be usually used, and it may be used when there are no spare blocks. With this address management, high reliability of the flash memory will be assured.

Further, in case the flash memory is in a pseudo-pass state, the memory controller 10 may set the order of priority for blocks in accordance with the fail bit number output on the terminals I/O2-I/O5. Note here that such the order of priority may also be set within the flash memory itself. With setting the order of priority as described above, the reliability of the flash memory may be further increased.

Although, in the embodiment described above, a NAND-type flash memory has been explained, the present invention may be adapted to other types of flash memory devices such as NOR-type, AND-type, DINOR-type and the like.

As an embodiment, an electric card using the non-volatile semiconductor memory devices according to the above-described embodiments 1-3 of the present invention and an electric device using the card will be described bellow.

Figure 11:
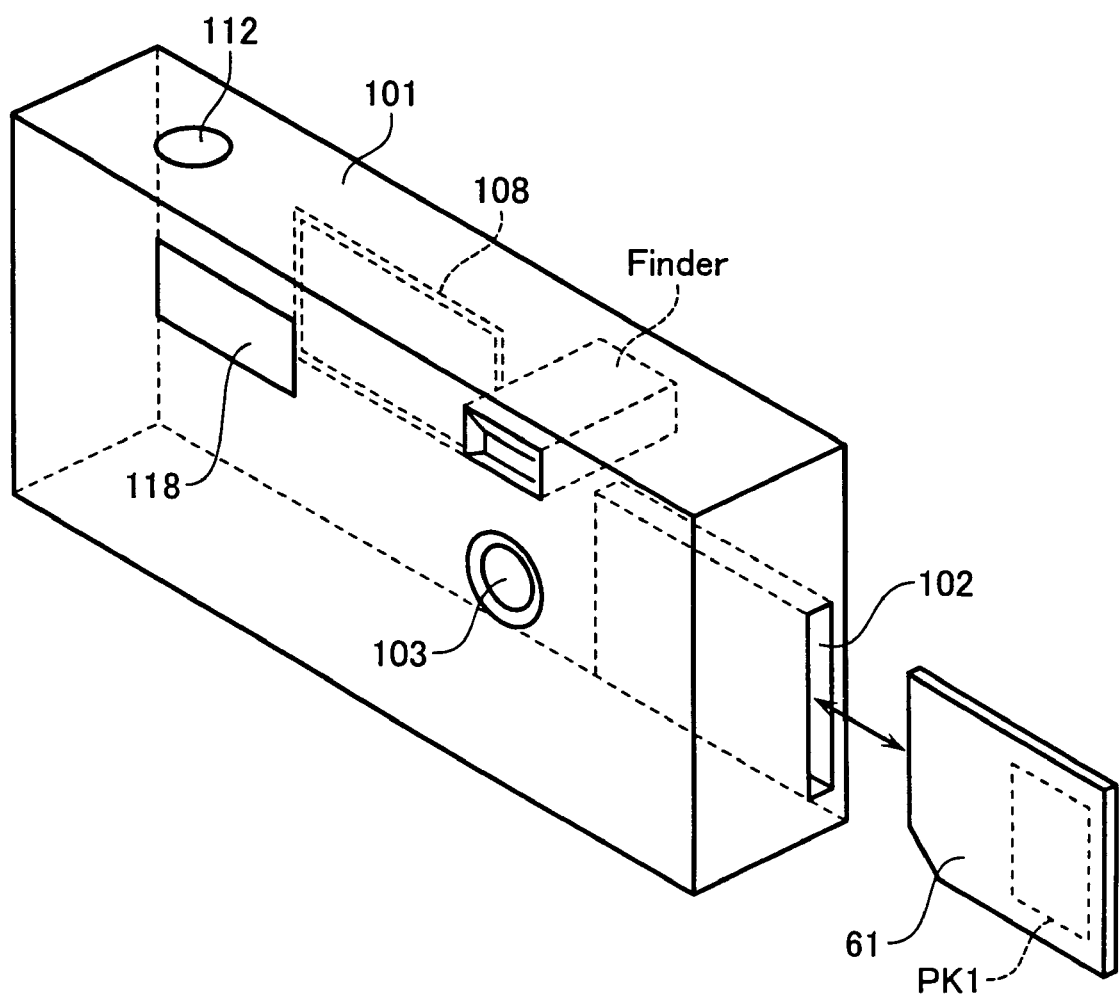
FIG. 11 shows another embodiment applied to a digital still camera.

FIG. 11 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 12:
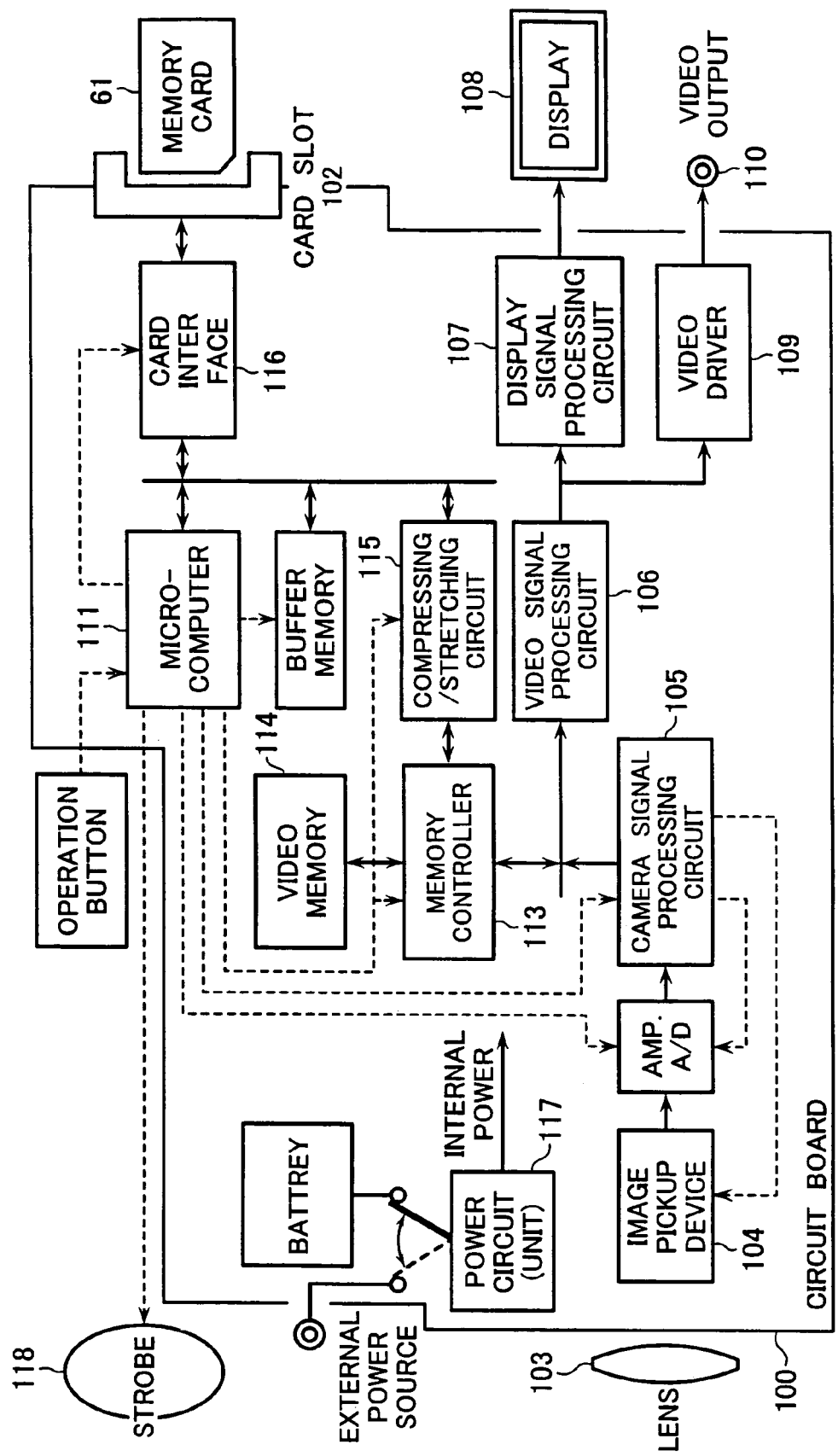
FIG. 12 shows the internal configuration of the digital still camera.
Figure 13A:
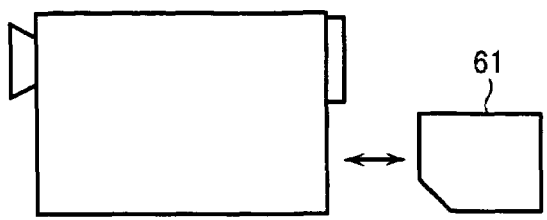
FIGS. 13A to 13J show other electric devices to which the embodiment is applied.
Figure 13F:
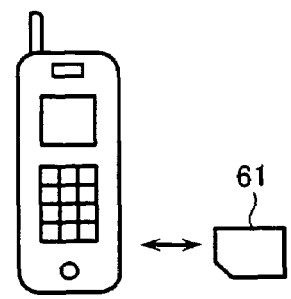
Figure 13B:
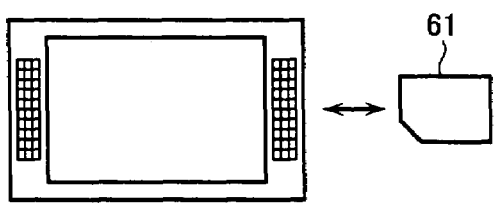
Figure 13G:
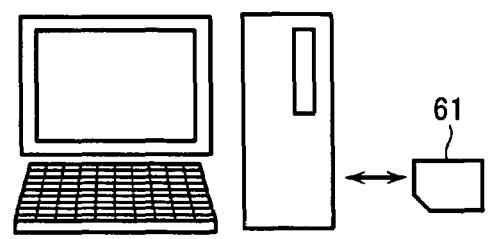
Figure 13C:
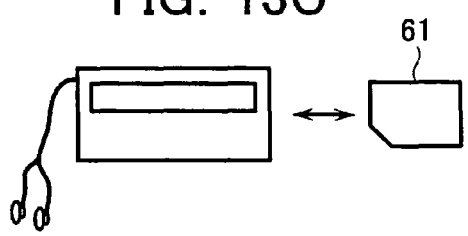
Figure 13H:
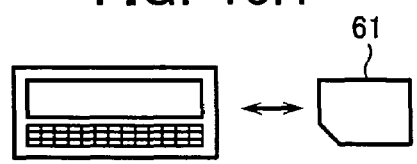
Figure 13D:
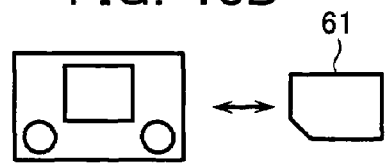
Figure 13I:
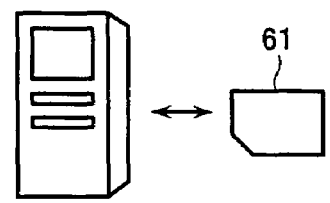
Figure 13E:
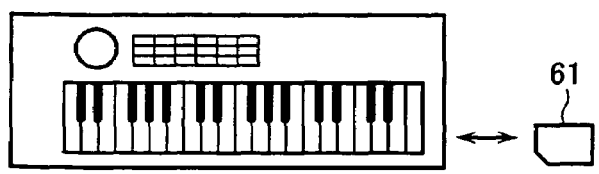
Figure 13J:
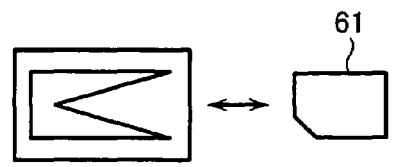

FIG. 12 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor. The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot. To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 13A to 13J, as well as in portable electric devices. That is, the electric card can also be used in a video camera shown in FIG. 13A, a television set shown in FIG. 13B, an audio apparatus shown in FIG. 13C, a game apparatus shown in FIG. 13D, an electric musical instrument shown in FIG. 13E, a cell phone shown in FIG. 13F, a personal computer shown in FIG. 13G, a personal digital assistant (PDA) shown in FIG. 13H, a voice recorder shown in FIG. 13I, and a PC card shown in FIG. 13J.

This invention is not limited to the above-described embodiment. It will be understood by those skilled in the art that various changes in form and detail may be made without departing from the spirit, scope, and teaching of the invention.

What is claimed is:

1. A non-volatile semiconductor memory device comprising:
   a memory cell array with electrically rewritable and non-volatile memory cells arranged therein;
   a data hold circuit configured to hold read data or write data of said memory cell array;
   a data bit detection circuit so connected to said data hold circuit as to detect a bit number of "0" or "1" in data held therein; and
   an internal control circuit, which serves for controlling data write, erase and read, and includes a data bit register for storing the bit number detected by said data bit detection circuit, said internal control circuit serving to output the bit number stored in said data bit register to external terminals in response to a command input,
   wherein said data bit detection circuit is a fail bit counter circuit, which detects a fail bit number in a data write mode or a data erase mode, and said data bit register is a fail bit register, which stores data of the fail bit number detected by said fail bit counter circuit, and
   wherein
   said internal control circuit performs sequence control by repeat of write or erase voltage application and the following verify operation, and makes said fail bit counter circuit detect a fail bit number held in said data hold circuit prior to the sequence ending due to that the number of write or erase cycles has reached a certain value, and then stores the detected result in said fail it register.

2. The non-volatile semiconductor memory device according to claim 1, wherein
said internal control circuit further includes a status register for storing status data defined by the detected result of said fail bit counter circuit, and outputs the status data stored in said status register together with the bit number stored in said data bit register to the external terminals in response to the command input.

3. The non-volatile semiconductor memory device according to claim 2, wherein
the status data is output to the external terminals as such two-bit data that "00" designates a true pass state; "10" a pseudo-pass state where the fail bit number is in a permissible range with relation to an error correcting function of the device; and "11" a fail state.

4. The non-volatile semiconductor memory device according to claim 1, wherein
said data bit detection circuit comprises:
a first current generating circuit configured to generate a first current proportional to a bit number to be detected;
a second current generating circuit configured to have plural current sources with different current levels each other and generate a second current selected in the current sources, which serves as a reference for judging the bit number to be detected; and
a comparator circuit configured to compare the first current with the second current, and output a detection signal designating whether the bit number to be detected is over a certain value or not.

5. The semiconductor memory device according to claim 1, wherein
said memory cell array is formed of NAND cell units arranged therein, each of NAND cell unit having plural memory cells connected in series.

6. An electric device equipped with a non-volatile semiconductor memory device, said memory device comprising:
a memory cell array with electrically rewritable and non-volatile memory cells arranged therein;
a data hold circuit configured to hold read data or write data of said memory cell array;
a data bit detection circuit so connected to said data hold circuit as to detect a bit number of "0" or "1" in data held therein; and
an internal control circuit, which serves for controlling data write, erase and read, and includes a data bit register for storing the bit number detected by said data bit detection circuit, said internal control circuit serving to output the bit number stored in said data bit register to external terminals in response to a command input,
wherein said data bit detection circuit is a fail bit counter circuit, which detects a fail bit number in a data write mode or a data erase mode, and said data bit register is a fail bit register, which stores data of the fail bit number detected by said fail bit counter circuit, and wherein
said internal control circuit performs sequence control by repeat of write or erase voltage application and the following verify operation, and makes said fail bit counter circuit detect a fail bit number held in said data hold circuit prior to the sequence ending due to that the number of write or erase cycles has reached a certain value, and then stores the detected result in said fail bit register.

7. A non-volatile semiconductor memory device comprising:
a memory cell array with electrically rewritable and non-volatile memory cells arranged therein;
a data hold circuit configured to hold verify-read data at a data write time or at a data erase time;
a fail bit counter circuit configured to count a fail bit number based on the data held in said data hold circuit prior to ending of data write or erase in failure; and
an internal control circuit configured to control data write, read and erase of said memory cell array, said internal control circuit comprising a fail bit register, to which the fail bit number detected by said fail bit count circuit is transferred and stored in; and
a status register configured to store status data defined based on the result detected by said fail bit counter circuit,
wherein said internal control circuit performs sequence control by repeat of write or erase voltage application and the following verify operation, and makes said fail bit counter circuit detect a fail bit number held in said data hold circuit prior to the sequence ending due to that the number of write or erase cycles has reached a certain value, thereby storing the detected result in said fail bit register and storing the status data defined based on the result detected by said fail bit counter circuit in said status register, and
wherein the status data is output together with the fail bit number to the external terminals in response to a certain command input.

8. The non-volatile semiconductor memory device according to claim 7, wherein
the status data is output to the external terminals as such two-bit data that "00" designates a true pass state; "10" a pseudo-pass state where the fail bit number is in a permissible range with relation to an error correcting function of the device; and "11" a fail state.

9. The non-volatile semiconductor memory device according to claim 7, wherein
said fail bit counter circuit comprises:
a first current generating circuit configured to generate a first current proportional to a bit number to be detected;
a second current generating circuit configured to have plural current sources with different current levels each other and generate a second current selected in the current sources, which serves as a reference for judging the bit number to be detected; and
a comparator circuit configured to compare the first current with the second current, and output a detection signal designating whether the bit number to be detected is over a certain value or not.

10. The semiconductor memory device according to claim 7, wherein
said memory cell array is formed of NAND cell units arranged therein, each of NAND cell unit having plural memory cells connected in series.

11. A memory system comprising: a flash memory device; and an ECC circuit prepared inside or outside of said flash memory device for correcting read data thereof, wherein
said flash memory device has a function of: detecting a fail bit number in the device; and outputting a status data defined based on the detected fail bit number to external terminals, and wherein in case the detected fail bit number is in a permissible range with relation to the error correcting function of said ECC circuit, the status data is so output as to designate a pseudo-pass state.

12. The memory system according to claim 11, wherein the status data is such a two-bit data that "00" designates a true pass state; "10" a pseudo-pass state; and "11" a fail state.

13. The memory system according to claim 11, further comprising a memory controller for controlling data write, read and erase of said flash memory device, wherein
said memory controller performs such address management in response to the status data output from the flash memory device as to temporarily register a pseudo-pass block as a bad block not to be usually used.

14. The memory system according to claim 11, wherein said flash memory device is of a NAND-type.

15. A non-volatile semiconductor memory device comprising:
a memory cell array with electrically rewritable and non-volatile memory cells arranged therein;
a data hold circuit configured to hold read data or write data of said memory cell array; and
an internal control circuit, which serves for controlling data write, erase and read, and includes a data bit register for storing a bit number of "0" data or "1" data held in said data hold circuit,
said internal control circuit serving to output the bit number stored in said data bit register to external terminals in response to a command input,
wherein said data bit register is a fail bit register, which stores data of the fail bit number, and
wherein said internal control circuit performs sequence control by repeat of write or erase voltage application and the following verify operation, and detect a fail bit number held in said data bit hold circuit prior to the sequence ending due to that the number of write or erase cycles has reached a certain value, and then stores the detected result in said fail bit register.

* * * * *